(12) United States Patent
Singh et al.

(10) Patent No.: US 7,797,131 B2
(45) Date of Patent: Sep. 14, 2010

(54) ON-CHIP FREQUENCY RESPONSE MEASUREMENT

(75) Inventors: Deepak K. Singh, Apex, NC (US); Francois Ibrahim Atallah, Raleigh, NC (US); David John Seman, Apex, NC (US)

(73) Assignee: International Business Machines Corporation, Armonk, NY (US)

( * ) Notice: Subject to any disclaimer, the term of this patent is extended or adjusted under 35 U.S.C. 154(b) by 410 days.

(21) Appl. No.: 11/844,393

(22) Filed: Aug. 24, 2007

(65) Prior Publication Data

US 2009/0055122 A1    Feb. 26, 2009

(51) Int. Cl.
G06F 19/00 (2006.01)
G06F 17/40 (2006.01)

(52) U.S. Cl. .................. 702/182; 702/187; 713/500

(58) Field of Classification Search ............ 73/865.8, 73/865.9; 324/500, 537, 765; 377/1, 16, 377/19, 20; 702/1, 33, 34, 108, 117, 124, 702/125, 127, 182, 186, 187; 713/500; 714/699, 714/709, 724

See application file for complete search history.

(56) References Cited

U.S. PATENT DOCUMENTS

| | | | | |
|---|---|---|---|---|
| 4,417,470 A | 11/1983 | McCracken et al. | ......... | 374/136 |
| 5,375,146 A | 12/1994 | Chalmers | .................... | 375/350 |
| 5,451,894 A | 9/1995 | Guo | ............ | 327/241 |
| 5,457,719 A | 10/1995 | Guo et al. | ................... | 375/373 |
| 5,737,342 A | 4/1998 | Ziperovich | ................ | 371/25.1 |
| 5,844,826 A | 12/1998 | Nguyen | .................... | 364/715.1 |
| 5,852,616 A | 12/1998 | Kubinec | .................... | 371/21.1 |
| 5,990,725 A | 11/1999 | LoCascio | | |
| 6,037,732 A | 3/2000 | Alfano et al. | | |
| 6,047,248 A | 4/2000 | Georgiou et al. | | |
| 6,058,502 A | 5/2000 | Sakaguchi | .................. | 714/811 |
| 6,070,074 A | 5/2000 | Perahia et al. | ............. | 455/430 |
| 6,076,157 A | 6/2000 | Borkenhagen et al. | ...... | 712/228 |
| 6,111,414 A | 8/2000 | Chatterjee et al. | ........... | 324/633 |
| 6,125,334 A | 9/2000 | Hurd | ........................... | 702/60 |
| 6,141,762 A | 10/2000 | Nicol et al. | ................. | 713/300 |
| 6,172,611 B1 | 1/2001 | Hussain et al. | | |
| 6,212,544 B1 | 4/2001 | Borkenhagen et al. | ...... | 709/103 |

(Continued)

FOREIGN PATENT DOCUMENTS

CN    1716161    1/2006

(Continued)

OTHER PUBLICATIONS

Schweber, A/D and D/A Converters: Critical links that just keep getting better, Apr. 1989, 4 pages.

(Continued)

*Primary Examiner*—Edward R Cosimano
(74) *Attorney, Agent, or Firm*—Thomas E. Tyson; Joseelyn G. Cockburn; Cynthia Seal

(57) ABSTRACT

A method and circuit are provided for measuring frequency response performance of an integrated circuit by providing a pulse having a rising edge and a falling edge where the pulse is provided to a plurality of serially connected components. The number of these components which have propagated the leading edge of the pulse before the occurrence of the falling edge provide a numeric indication of the circuit's frequency response and performance.

17 Claims, 5 Drawing Sheets

U.S. PATENT DOCUMENTS

| | | |
|---|---|---|
| 6,351,601 B1 | 2/2002 | Judkins, III |
| 6,429,796 B1 | 8/2002 | Buckley |
| 6,481,974 B2 | 11/2002 | Horng et al. |
| 6,591,210 B1 | 7/2003 | Lorenz |
| 6,625,635 B1 | 9/2003 | Elnozahy ............... 709/102 |
| 6,713,996 B2 | 3/2004 | Iorio |
| 6,721,581 B1 | 4/2004 | Subramanian |
| 6,721,892 B1 | 4/2004 | Osborn |
| 6,838,917 B2 * | 1/2005 | Brass et al. ............. 327/158 |
| 6,859,113 B2 | 2/2005 | Giousouf |
| 6,897,673 B2 | 5/2005 | Savage et al. ........... 324/765 |
| 7,086,058 B2 | 8/2006 | Luick |
| 7,093,109 B1 | 8/2006 | Davis et al. ............. 712/228 |
| 7,096,140 B2 | 8/2006 | Nozuyama et al. ....... 702/117 |
| 7,100,061 B2 | 8/2006 | Halepete et al. ......... 713/322 |
| 7,174,194 B2 | 2/2007 | Chauvel et al. .......... 455/574 |
| 7,184,936 B1 | 2/2007 | Bhandari ................ 702/189 |
| 7,211,977 B2 | 5/2007 | Squibb |
| 7,228,446 B2 | 6/2007 | Jorgenson et al. ........ 713/300 |
| 7,282,966 B2 | 10/2007 | Narendra et al. .......... 327/99 |
| 7,307,439 B2 | 12/2007 | Takamiya et al. ........ 324/763 |
| 7,330,081 B1 | 2/2008 | Asa et al. ................ 331/57 |
| 7,330,983 B2 | 2/2008 | Chaparro |
| 7,437,581 B2 | 10/2008 | Grochowski et al. |
| 2002/0046399 A1 | 4/2002 | Debling ................. 717/138 |
| 2002/0065049 A1 | 5/2002 | Chauvel et al. ........... 455/66 |
| 2003/0030483 A1 | 2/2003 | Seki et al. ............... 327/540 |
| 2003/0057986 A1 * | 3/2003 | Amick et al. ............ 324/760 |
| 2003/0067334 A1 * | 4/2003 | Brass et al. ............. 327/158 |
| 2003/0079150 A1 | 4/2003 | Smith et al. |
| 2003/0126476 A1 | 7/2003 | Greene et al. ........... 713/300 |
| 2003/0184399 A1 | 10/2003 | Lanoue et al. ........... 331/176 |
| 2004/0023688 A1 | 2/2004 | Bazarjani et al. ......... 455/557 |
| 2004/0025061 A1 | 2/2004 | Lawrence |
| 2004/0090216 A1 | 5/2004 | Carballo et al. .......... 323/234 |
| 2004/0183613 A1 | 9/2004 | Kurd et al. ............. 331/186 |
| 2004/0268280 A1 | 12/2004 | Eleyan et al. ............... 716/6 |
| 2005/0114056 A1 | 5/2005 | Patel |
| 2005/0116733 A1 | 6/2005 | Barr et al. ............. 324/763 |
| 2005/0174102 A1 | 8/2005 | Saraswat et al. ......... 324/102 |
| 2005/0209740 A1 | 9/2005 | Vann, Jr. |
| 2005/0278520 A1 | 12/2005 | Hirai et al. ................ 713/1 |
| 2005/0289367 A1 | 12/2005 | Clark et al. ............ 713/300 |
| 2006/0066376 A1 | 3/2006 | Narendra |
| 2006/0149974 A1 | 7/2006 | Rotem et al. ........... 713/300 |
| 2006/0197697 A1 | 9/2006 | Nagata ................... 342/22 |
| 2006/0247873 A1 | 11/2006 | Fung et al. ............... 702/64 |
| 2007/0006007 A1 | 1/2007 | Woodbridge et al. |
| 2007/0074216 A1 | 3/2007 | Adachi et al. ........... 718/102 |
| 2007/0192650 A1 * | 8/2007 | Shiota .................. 713/600 |
| 2007/0260895 A1 | 11/2007 | Aguilar et al. ........... 713/300 |
| 2008/0004755 A1 | 1/2008 | Dunstan et al. |
| 2008/0136400 A1 * | 6/2008 | Chi et al. ............... 323/318 |
| 2009/0055454 A1 * | 2/2009 | Singh et al. ............. 708/210 |
| 2009/0055456 A1 * | 2/2009 | Singh .................... 708/290 |

FOREIGN PATENT DOCUMENTS

WO    WO 2006/072106 A2    6/2006

OTHER PUBLICATIONS

PCT International Search Report, mailed oJun. 16, 2008, for PCT application EP2008/050922, 4 pages.

PCT International Search Report, mailed Feb. 5, 2008, for PCT application EP2008/050919, 3 pages.

Gupta and Rincon-Mora, "Predicting the Effects of Error Sources in Bandgap Reference Circuits and Evaluating Their Design Implications" IEEE's Midwest Symposium on Circuits and Systems (MWSCAS), vol. 3, pp. 575-578, Tulsa, Oklahoma, 2002.

//en.wikipedia.org/wiki/Bandgap_voltage_reference.

Moore, B.D.; "Tradeoffs in Selecting IC Temperature Sensors"; 1999; Elsevier Science; pp. 181-184.

* cited by examiner

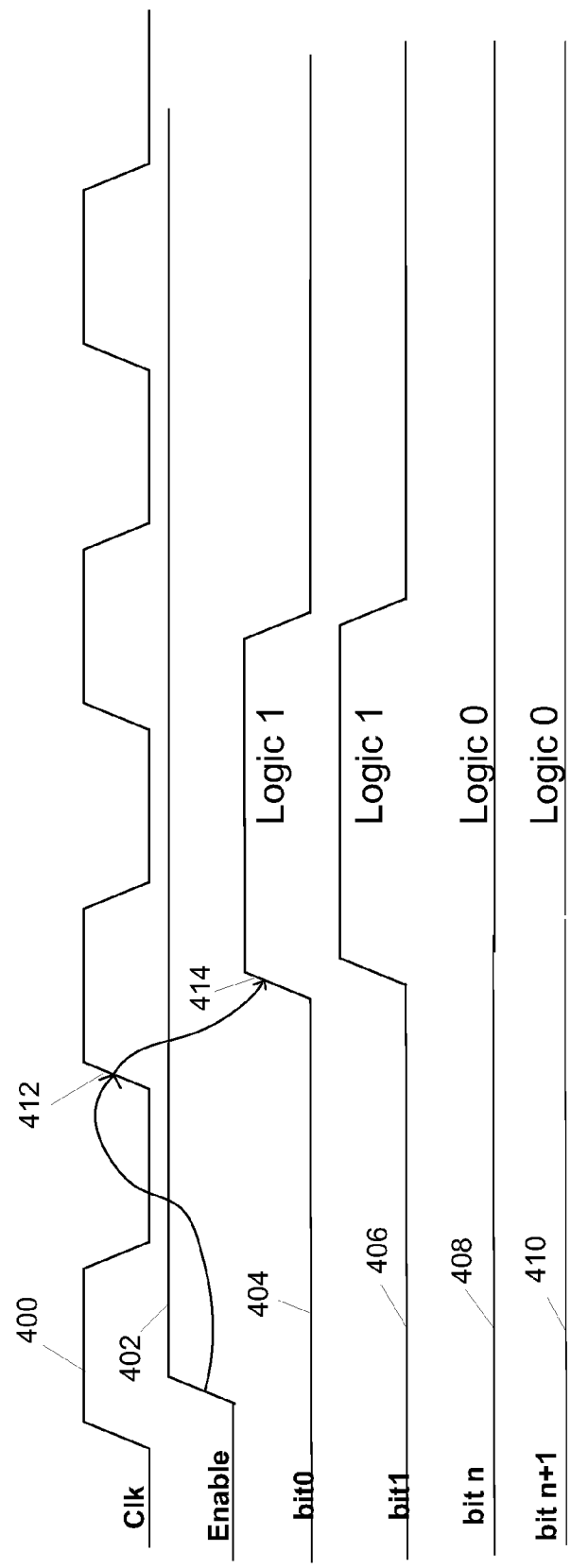

2

ON-CHIP FREQUENCY RESPONSE MEASUREMENT

RELATED APPLICATIONS

This application is related to the following co-pending U.S. Patent Applications filed on the same day as the present application and having the same assignee: (pending patent application Ser. Nos. 11/844,402 and 11/844,405).

BACKGROUND OF THE INVENTION

1. Technical Field

The present invention relates in general to a circuit and method for measuring frequency response on an integrated circuit. In particular, the present invention relates to a system and method for measuring frequency response at specific integrated circuit locations.

2. Description of the Related Art

Many modern data processing systems include multiple central processing unit cores (CPUs) located on a single semiconductor substrate of an integrated circuit. Data processing systems including such integrated circuits will execute instructions of a single program across these multiple CPUs. One technique to employ the multiple CPUs in the execution of these instructions is to divide the instructions into groups of instructions or threads. Then each group or thread is directed to a central processing unit for execution. In directing a thread to a specific CPU for its instruction execution, it is desirable to determine which CPU would be able to execute the instructions most efficiently. The co-pending patent application "Using IR Drop Data for Instruction Thread Direction," (pending patent application Ser. No. 11/671,613) addresses this feature. This co-pending application is related to several other co-pending patent applications which address the measurement of physical characteristics on an integrated circuit in order to regulate supply voltage, predict performance and address other functions. These other co-pending patent applications include On-Chip Adaptive Voltage Compensation," (pending patent application Ser. No. 11/671,485); "Using Performance Data for Instruction Thread Direction," (pending patent application Ser. No. 11/671,627); "Using Temperature Data for Instruction Thread Direction," (pending patent application Ser. No. 11/671,640); "Integrated Circuit Failure Prediction," patent application Ser. No. 11/671,599 issued as U.S. Pat. No. 7,560,945); "Instruction Dependent Dynamic Voltage Compensation," (pending patent application Ser. No. 11/671,579); "Temperature Dependent Voltage Source Compensation," (pending patent application Ser. No. 11/671,568); "Fan Speed Control from Adaptive Voltage Supply," (pending patent application Ser. No. 11/671,555); and "Digital Adaptive Voltage Supply," (pending patent application Ser. No. 11/671,531 issued as U.S. Pat. No. 7,714,635); each assigned to the IBM Corporation and herein incorporated by reference.

In a co-pending patent application entitled "Half Width Counting Leading Zero Circuit" also assigned to IBM and herein incorporated by reference, a more efficient count leading zero circuit is disclosed which can be used as part of a frequency response measurement circuit disclosed in this application. In addition, a second co-pending patent application entitled "Data Correction Circuit" (pending patent application Ser. No. 11/844,405) also assigned to IBM and herein incorporated by reference, addresses a correction circuit that is used to correct input values to the count leading zeros circuit.

One physical condition of the CPUs for determining performance is the variation in the frequency response of a semiconductor substrate portion containing the CPU. Such variation in the frequency response is inherently due to the manufacturing process. The number of CPU cores that can be implemented on a single semiconductor substrate is proportional to the area of the single semiconductor substrate. In a single semiconductor substrate with large area, the performance of individual devices contained in cores that are not within close spatial proximity differs due to minor changes in semiconductor manufacturing process across the single semiconductor substrate. The net effect of this is that CPUs that are separated offer different frequency responses or performance. Usually, the higher measured frequency response will indicate a more efficient central processing unit.

One way to address this difference in performance of the CPUs across the single semiconductor substrate is to measure frequency response at these different CPU locations. This was accomplished in the above co-pending patent applications by using a loop oscillator which generates an output frequency. This frequency is analyzed along with other physical characteristics of the CPU to predict instruction execution performance. This performance information can be used to direct instruction threads to specific CPUs for a faster instruction execution. FIG. 1 is a block diagram of an adaptive voltage supply that could be configured to provide this performance information.

The loop oscillator output frequency must be analyzed to determine its performance component. When using digital circuitry, this loop oscillator frequency output, an analog output, must be converted to a digital form before the performance can be determined. What is needed is a more direct way to indicate this frequency response performance component.

SUMMARY

In accordance with the present invention, a method is provided for measuring frequency response in an integrated circuit including the steps of first, providing a pulse having a first transition edge and a second transition edge. The pulse is provided to a plurality of serially connected components. The second step is counting the number of components that propagate the pulse before the second transition edge occurs.

In one embodiment of the present invention, a circuit for measuring' integrated circuit performance is provided that includes a clock for providing a single pulse gated by an enable input signal, a plurality of serially connected components connected to receive the pulse, and a group of latches and where each latch is connected to a unique one of the serially connected components to store the output of its component. The latches are further connected to each receive the pulse. The contents of the latches provides an indication of how many of the serially connect components propagated the pulse between the pulse rising edge and the pulse falling edge.

BRIEF DESCRIPTION OF THE DRAWINGS

The present invention may be better understood, and its numerous objects, features, and advantages made apparent to those skilled in the art by referencing the accompanying drawings.

FIG. 3 is a diagram of a digital data word of N bits;

FIG. 4 is a waveform diagram illustrating the operation of the signal propagation circuit in FIG. 2;

DETAILED DESCRIPTION

The following is intended to provide a detailed description of an example of the invention and should not be taken to be limiting of the invention itself. Rather, any number of variations may fall within the scope of the invention, which is defined in the claims following the description.

Figure 1:
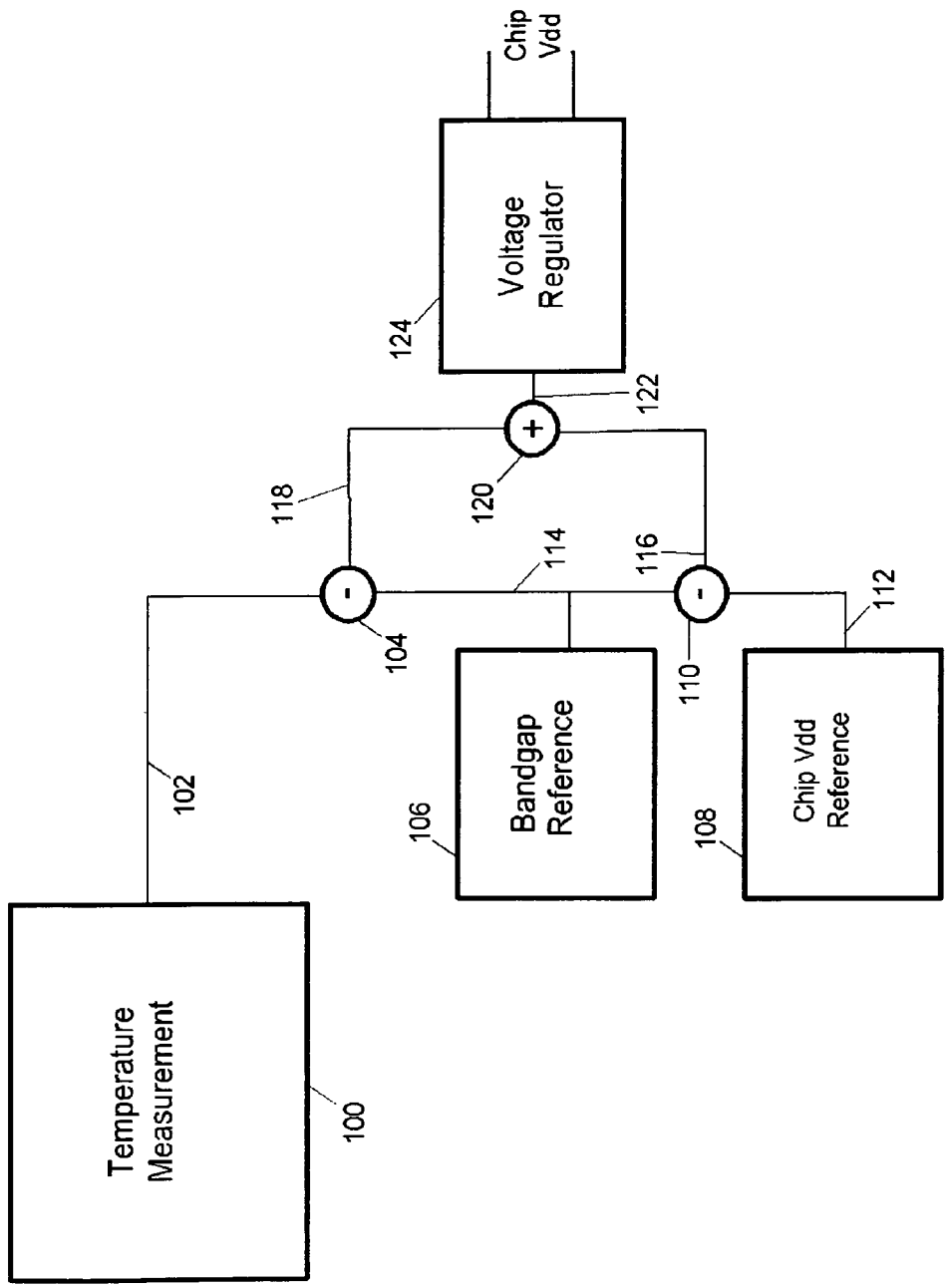
FIG. 1 is a block diagram of an adaptive voltage supply circuit including components for measuring physical characteristic of an integrated circuit.

FIG. 1 is a block diagram of a voltage regulator that is used on an integrated circuit. The output voltage is controlled in accordance with measurements of the temperature, the bandgap voltage, and the chip Vdd voltage. The temperature measurement is accomplished in block 100 and it provides an output on line 102 to a differencing circuit 104 which also receives on line 114 a bandgap reference voltage input measured by block 106. Differencing circuit 104 provides its output on line 118. Likewise both the bandgap reference voltage in block 106 and the chip Vdd reference voltage measured in block 108 are provided to a differencing circuit 110. The chip Vdd reference voltage from block 108 is provided on line 112 to the differencing circuit 110. The summing circuit 120 then receives the data on line 118 from the differencing circuit 104 and the output of the differencing circuit 110 on line 116. These inputs are summed to provide an output on line 122 to the voltage regulation circuit 124. As previously explained, the output voltage of the voltage regulator in block 124 is then adjusted in accordance with this signal on line 122.

The voltage regulator of FIG. 1 is discussed in much more detail in the previously referenced patent application entitled "Using IR Drop Data for Instruction Thread Direction," (pending patent application Ser. No. 11/671,613).

This voltage regulator application illustrates the environment in which the frequency response measurement is employed. In this voltage regulator application, both of the bandgap reference measurement and the chip Vdd reference measurement are accomplished by measuring frequency signals from loop oscillators and, in the case of a digital implementation of this circuit, converted into a digital form.

Figure 2:
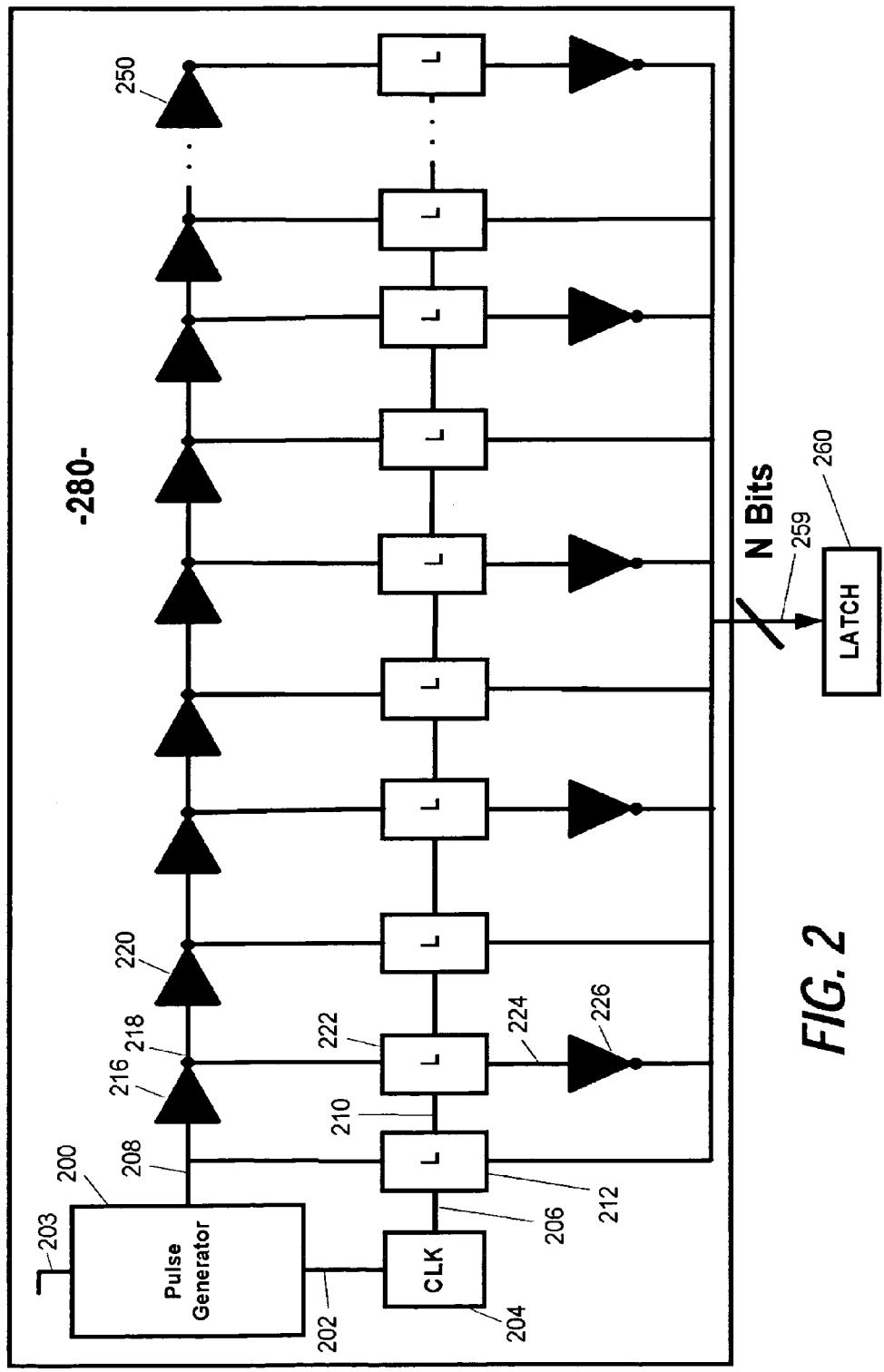
FIG. 2 is a schematic diagram of a signal propagation circuit.

FIG. 2 is a schematic diagram that illustrates a frequency response indicating circuit 280 according to the new invention. Block 280 includes a pulse generator 200 that is connected to a clock circuit 204 by line 202. In operation the pulse generator 200 receives the clock signal on line 202 together with an Enable signal on line 203 and produces a single pulse which is provided to a series of serially connected inverters such as 216 and 220 on lines 208 and 218. This single pulse is then propagated through the serially connected inverters where each inverter provides an output to its next serially connected inverter after a propagation delay. Latches, such as latches 212 and 222 are connected to receive the output of this pulse from pulse generator 200 on lines 208 and 218. For example, latch 212 immediately stores the output of the pulse generator from line 208 upon the occurrence of the pulse. This pulse on line 208 is then propagated through the inverter 216 and provides an output on line 218 which is then stored in latch 212. Likewise the signal is propagated to inverter 216 and to the other serially connected inverters as shown in FIG. 2. The output of each of the inverters is then stored in its respective output latch. Line 206 provides the clock signal from clock 204 to latch 212 and on line 210 to latch 222 and so forth through the array of latches in block 280 as shown. This clock signal on lines 206, 210 and so forth provides the activate and reset control signals for the latches.

As the pulse propagates through each successive inverter, it gets inverted. So half the inverters propagate an output that has a rising edge while the other half of the inverters produce a falling edge. The latches capture this raw falling or rising data. In order to provide uniform polarity for the captured data, inverters such as 226 are provided at the output of latch 222 by line 224 so that the output of all of the inverters that have propagated the pulse will be of the same polarity and likewise the output of the inverters that have not received and propagated the pulse will be of the same polarity as well. In this embodiment, those inverter/latch assemblies that have propagated the pulse will have a binary numeric value of "1" and those inverter/latch assemblies that have not propagated the pulse will have a binary numeric value of "0."

To summarize, in block 280 the serially connected inverters start with inverter 216 and continue through inverter 250. Each of these inverters includes its respective output latch and, in this embodiment, the odd numbered latches include their own respective output inverter. The output of block 280 is a parallel N bit wide data word on line 259 that is stored in latch 260.

In this embodiment, the value stored in this array of latches is a numeric value representing the number of inverters that have propagated the pulse before the pulse trailing edge has occurred. This numeric value which is on line 259, is representative of the frequency response of the integrated circuit and indicates integrated circuit performance.

FIG. 3 is a block diagram illustrating the contents of the latch 260 in FIG. 2 after a propagation cycle has occurred. Referring back to FIG. 2, upon the leading edge occurring on line 208 from the pulse generator 200, latch 212 will store a "1". This is illustrated in FIG. 3 as the value in bit position "0" being a "1". Bit position "0" is the Most Significant Bit (MSB) position and bit position "N" is the Least Significant Bit (LSB) position. Then each consecutive latch in block 208 will store the output of its connected inverter in a similar manner until the latch input is turned off by the trailing edge of the clock. At that point in time the value of the latches shown in FIG. 3 indicate how far down the serially connected array of inverters the pulse signal has traveled. In other words, in FIG. 3, the "1s" stored in the latches illustrate the number of inverters that have propagated the pulse before the trailing edge of the clock is occurred. The "0s" indicate the inverters that have not received the pulse. Therefore, the number of positions having a value of "1" is an indication of the propagation of the signal pulse and is used to indicate the frequency response and therefore is a performance predictor factor.

FIG. 4 is the waveform diagram illustrating the occurrence of the clock pulse 400 from the clock 204 in FIG. 2 which when combined with the Enable signal 402 initiates a single pulse generation by Pulse Generator 200 (FIG. 2). Waveform portion 412 is the rising edge of the clock pulse. The occurrence of this rising edge as previously discussed enables the latch 212 to store the value on line 208 as shown on line 404 with rising edge 414. Likewise latch 222 receives its input on line 406 in FIG. 4 and is also a "1". Lines 408 and 410 illustrate that those inverters that do not receive or propagate the pulse in block 280 to provide values of logic "0". As previously discussed, the latches get clocked every cycle. However, the pulse generator only generates a pulse when the Enable signal 402 is asserted. Therefore, the result of bits stored in latch 260 (FIG. 2) would resemble that indicated test "typical value" of FIG. 3.

Figure 5:
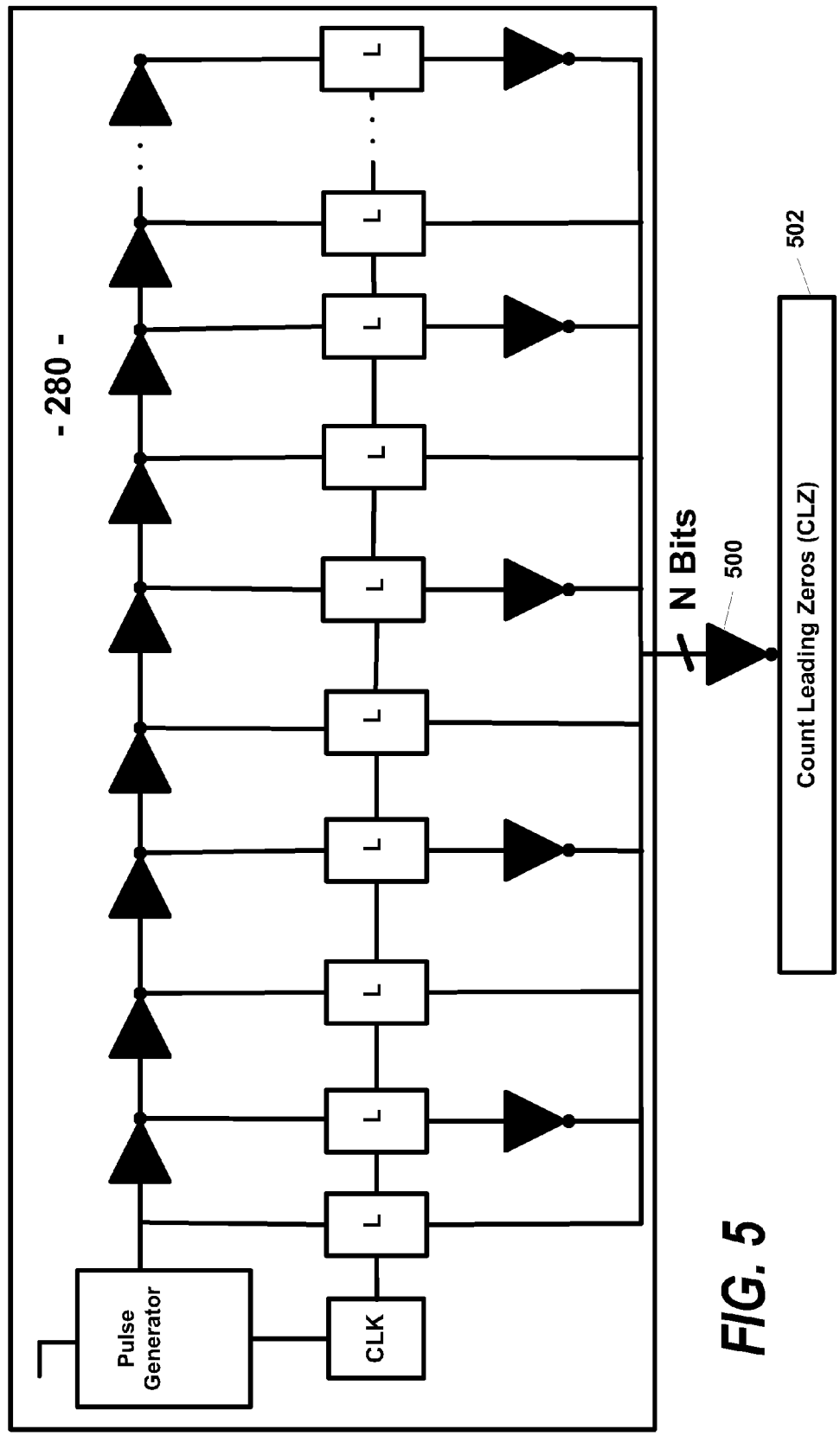
FIG. 5 is a schematic diagram of an embodiment of a frequency response circuit.

FIG. 5 is another embodiment illustrating the present invention. In FIG. 5, block 280 provides parallel outputs to a set of inverters represented by inverter 500. In other words, the N wide output lines from block 280 that indicated a binary value of one will be converted to indicate a binary value of zero. Likewise those N bit lines indicating a binary value of zero will then be inverted to represent a binary value one. These parallel lines from the inverter 500 are then provided to a count leading zero (CLZ) circuit 502 which program provides a numeric count of the number of leading zeros.

Figure 6:
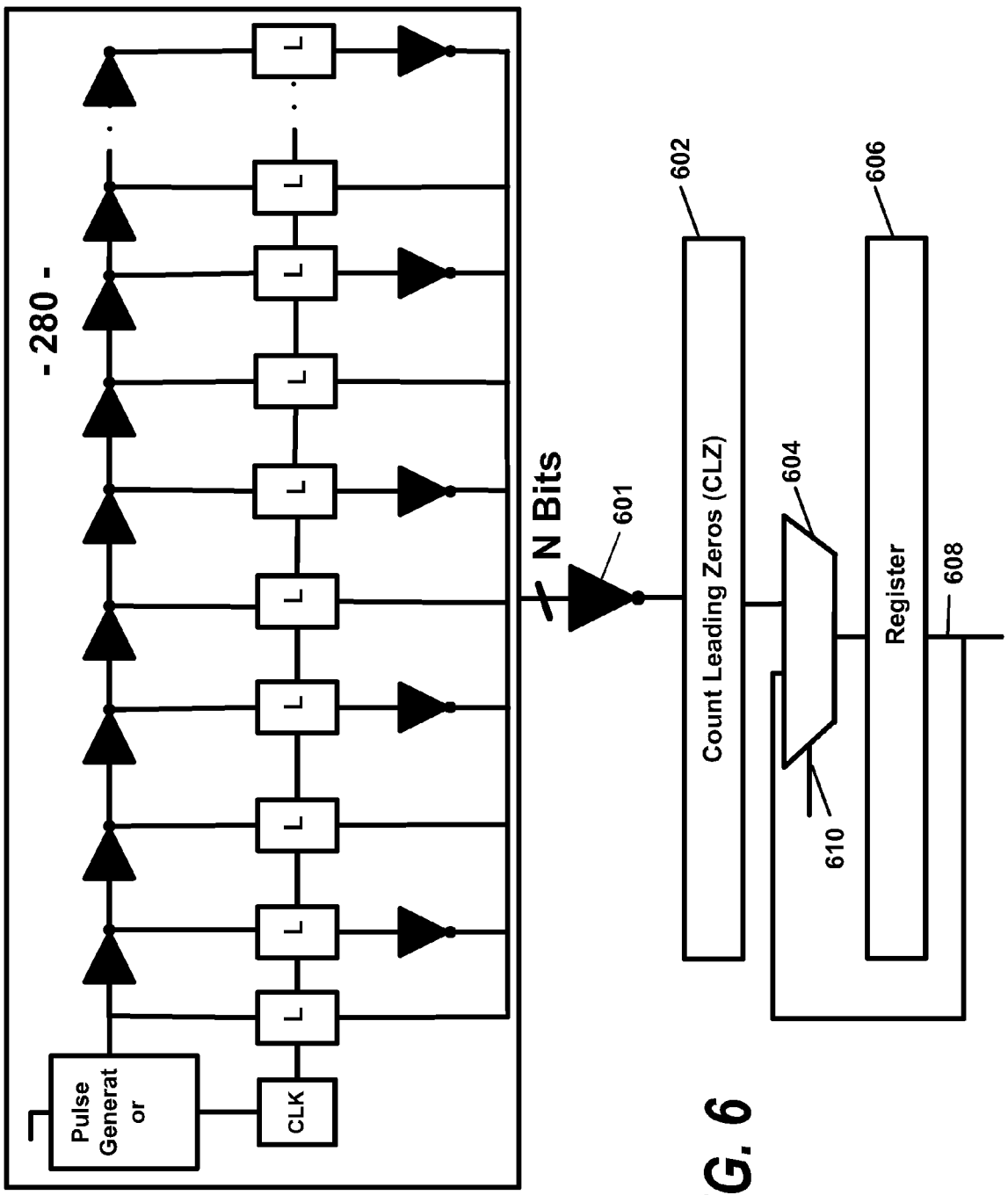
FIG. 6 is a schematic diagram of a second embodiment of the frequency response circuit of FIG. 5.

A preferred embodiment of the present invention is illustrated in FIG. 6. Block 280 provides N parallel lines out to inverters represented by inverter 601 which provide an N bit wide parallel inputs into the count leading zeros (CLZ) circuit 602 as before. The output of the CLZ circuit 602 which is a numeric value of $Log_2(N)$ bits wide and represents the number count of leading zeros. This value on line 602 is provided to a multiplexer 604 which when an Enable signal is present on line 610 provides an output to register 606. When the Enable signal on line 610 is not present the multiplexer is configured to provide the output of register 606 as an input back to register 606 on line 608 meaning that the contents of register 606 is unchanged. This would enable other circuitry to access the value in register 606 which is indicative of the circuit performance.

All of the measurement circuits are contained on the surface of this integrated circuit device in the preferred embodiment. These measurements are then used to scale an input control signal to a voltage regulation circuit which, in one embodiment, is also contained on the surface of the integrated circuit device or alternatively on another integrated circuit. The output of this voltage regulation device provides the integrated circuit operating voltage (Vdd).

While particular embodiments of the present invention have been shown and described, it will be obvious to those skilled in the art, based upon the teachings herein, that changes and modifications may be made without departing from this invention and its broader aspects. Therefore, the appended claims are to encompass within their scope all such changes and modifications as are within the true spirit and scope of this invention. Furthermore, it is to be understood that the invention is solely defined by the appended claims. It will be understood by those with skill in the art that if a specific number of an introduced claim element is intended, such intent will be explicitly recited in the claim, and in the absence of such recitation no such limitation is present. For non-limiting example, as an aid to understanding, the following appended claims contain usage of the introductory phrases "at least one" and "one or more" to introduce claim elements. However, the use of such phrases should not be construed to imply that the introduction of a claim element by the indefinite articles "a" or "an" limits any particular claim containing such introduced claim element to inventions containing only one such element, even when the same claim includes the introductory phrases "one or more" or "at least one" and indefinite articles such as "a" or "an"; the same holds true for the use in the claims of definite articles.

What is claimed is:

1. A method of measuring frequency response performance in an integrated circuit comprising the steps of:
   providing a pulse having a first transition edge and a second transition edge, said pulse provided to a plurality of serially connected components, and
   counting the number of components which have propagated the pulse after the first transition edge of the pulse before the occurrence of the second transition edge.

2. A method according to claim 1, further including the step of storing the outputs of components that have propagated the pulse.

3. A method according to claim 2, wherein the serially connected components are inverters.

4. A method according to claim 3, wherein said step of storing the counted number includes inputting the output of the each serially connected component into a unique latch where every other latch includes an inverted output.

5. A method according to claim 4 further including a step of storing the outputs of the latches that both include inverted outputs and non-inverted outputs.

6. A method according to claim 5 wherein said step of storing the number includes the step of locking the content of the latches.

7. A circuit for measuring integrated circuit performance comprising:
   a clock providing a pulse;
   a plurality of serially connected components connected to receive the pulse; and
   a first plurality of latches, each latch connected to a unique one of said serially connected components, and said plurality of latches connected to receive the pulse wherein the latch value provides an indication of integrated circuit performance.

8. A circuit according to claim 7 where the clock provides a single pulse having a rising edge and a falling edge.

9. A circuit according to claim 8 wherein said serially connected components are inverters and said plurality of latches include inputs connected to its corresponding inverter output and every other latch output is further connected to an inverter.

10. A circuit according to claim 9 wherein a second plurality of latches is connected to receive the output of the first plurality of latches.

11. A computer program product containing instructions for execution by a computer, which, when executed by the computer, cause the computer to implement a method for:
    providing a pulse having a rising edge and a falling edge, said pulse provided to a plurality of serially connected components, and
    counting the number of components which have propagated the leading edge of the pulse before the occurrence of the falling edge.

12. The computer program product of claim 11 further including the step of storing the counted number.

13. The computer program product of claim 12, wherein the serially connected components are inverters.

14. The computer program product of claim 13, wherein said step of storing the counted number includes inputting the output of the each serially connected component into a unique latch where every other latch includes an inverted output.

15. The computer program product of claim 14, further including a step of storing the outputs of the latches that both include inverted outputs and non-inverted outputs.

16. The computer program product of claim 15 wherein said step of storing the number includes the step of locking the content of the latches.

17. The computer program product of claim 16 further including the step of determining the number of like binary values in the latches.

* * * * *